(12) United States Patent
Kenyon et al.

(10) Patent No.: US 10,475,994 B2
(45) Date of Patent: Nov. 12, 2019

(54) OXIDE MEMORY RESISTOR INCLUDING SEMICONDUCTOR NANOPARTICLES

(75) Inventors: Anthony Joseph Kenyon, London (GB); Adnan Mehonic, London (GB)

(73) Assignee: UCL Business PLC, London (GB)

( * ) Notice: Subject to any disclaimer, the term of this patent is extended or adjusted under 35 U.S.C. 154(b) by 256 days.

(21) Appl. No.: 14/130,604

(22) PCT Filed: Jul. 5, 2012

(86) PCT No.: PCT/GB2012/051574
§ 371 (c)(1),
(2), (4) Date: Mar. 19, 2014

(87) PCT Pub. No.: WO2013/005040
PCT Pub. Date: Jan. 10, 2013

(65) Prior Publication Data
US 2014/0291602 A1    Oct. 2, 2014

(30) Foreign Application Priority Data

Jul. 5, 2011 (GB) .................................... 1111513.6

(51) Int. Cl.
*H01L 45/00* (2006.01)
*H01L 27/24* (2006.01)
*G11C 13/00* (2006.01)

(52) U.S. Cl.
CPC .......... *H01L 45/08* (2013.01); *G11C 13/0002* (2013.01); *G11C 13/0007* (2013.01);
(Continued)

(58) Field of Classification Search
CPC ... H01L 45/08; H01L 45/145; H01L 45/1233; H01L 45/1625; H01L 45/1641; H01L 45/1608; H01L 45/146; H01L 45/165; H01L 27/2472; G11C 2213/33; G11C 2213/34

See application file for complete search history.

(56) References Cited

U.S. PATENT DOCUMENTS 8,592,791 B2 * 11/2013 Tour .................... G11C 13/0002
257/3
2005/0036368 A1 * 2/2005 Yeh et al. ................ 365/185.14
(Continued)

FOREIGN PATENT DOCUMENTS

WO    WO 2012/071100 A1    5/2012

OTHER PUBLICATIONS

Ivanda et al. "Quantifying inhomogeneities in silicon-rich oxide thin films", SPIE Newsroom, Apr. 2, 2013, DOI: 10.1117/2.1201303. 004785.*

(Continued)

*Primary Examiner* — Yu Chen
(74) *Attorney, Agent, or Firm* — BakerHostetler

(57) ABSTRACT

This invention relates to memory resistors, arrays of memory resistors and a method of making memory resistors. In particular, this invention relates to memory resistors having an on state and an off state, comprising: (a) a first electrode; (b) a second electrode; (c) a dielectric layer disposed between the first and second electrodes; wherein the dielectric layer comprises nanoparticles of semiconductor material, and wherein in the on state nanoparticles form at least one conductive filament encapsulated by the dielectric layer, thereby providing a conductive pathway between the first electrode and the second electrode.

8 Claims, 19 Drawing Sheets

(52) U.S. Cl.
CPC ...... *G11C 13/0009* (2013.01); *H01L 27/2472* (2013.01); *H01L 45/1233* (2013.01); *H01L 45/145* (2013.01); *H01L 45/1608* (2013.01); *H01L 45/1625* (2013.01); *H01L 45/1641* (2013.01); *G11C 13/0011* (2013.01); *G11C 2213/15* (2013.01); *G11C 2213/33* (2013.01); *G11C 2213/34* (2013.01)

(56) References Cited

U.S. PATENT DOCUMENTS

| | | | |
|---|---|---|---|
| 2009/0194839 A1* | 8/2009 | Bertin | B82Y 10/00 257/476 |
| 2011/0038196 A1 | 2/2011 | Tour et al. | |
| 2012/0097914 A1* | 4/2012 | Yamamoto | H01L 27/2409 257/3 |
| 2013/0264536 A1* | 10/2013 | Tour | G11C 13/0007 257/5 |

OTHER PUBLICATIONS

U.S. Appl. No. 61/380,842, filed Sep. 8, 2010 (Year: 2010).*
Yao et al.; "Resistive Switches and Memories from Silicon Oxide"; Nano Letters; vol. 10; Oct. 2010; p. 4105-4110.
Basa et al.; "Electrical and Memory Properties of Silicon Nitride Structures with Embedded SI Nanocrystals"; Physica E—Low-Dimensional Systems and Nanostructures, Elesevier Science BV; vol. 38; Dec. 2006; p. 71-75.
Mehonic et al.; "Resistive Switching in Silicon Suboxide Films"; Journal of Applied Physics; vol. 111; Apr. 2012; p. 1-10.
International Application No. PCT/GB2012/051574; International Search Report and the Written Opinion; dated Oct. 5, 2012; 17 pages.
Yao, Jun. "Resistive Switching in Siox-Based Systems," Rice University; Houston, Texas; Oct. 2009.
Yao, Jun. "Resistive Switching and Memory Effects in Silicon Oxide Based Nanostructures," Rice University; Houston, Texas; Aug. 2011.
Yao et al. "Resistive Switches and Memories from Silicon Oxide," NanoLetters, American Chemical Society, vol. 10, pp. 4105-4110, Aug. 31, 2010; including Supporting Information.
Wang et al. "Nanoporous Silicon Oxide Memory," NanoLetters, American Chemical Society, vol. 14, pp. 4694-4699, Jul. 3, 2014; including Supporting Information.
"Rice's silicon oxide memories catch manufacturers' eye," Rice University press release, http://news.rice.edu/2014/07/10/rices-silicon-oxide-memories-catch-manufacturers-eye, Jul. 10, 2014.

* cited by examiner

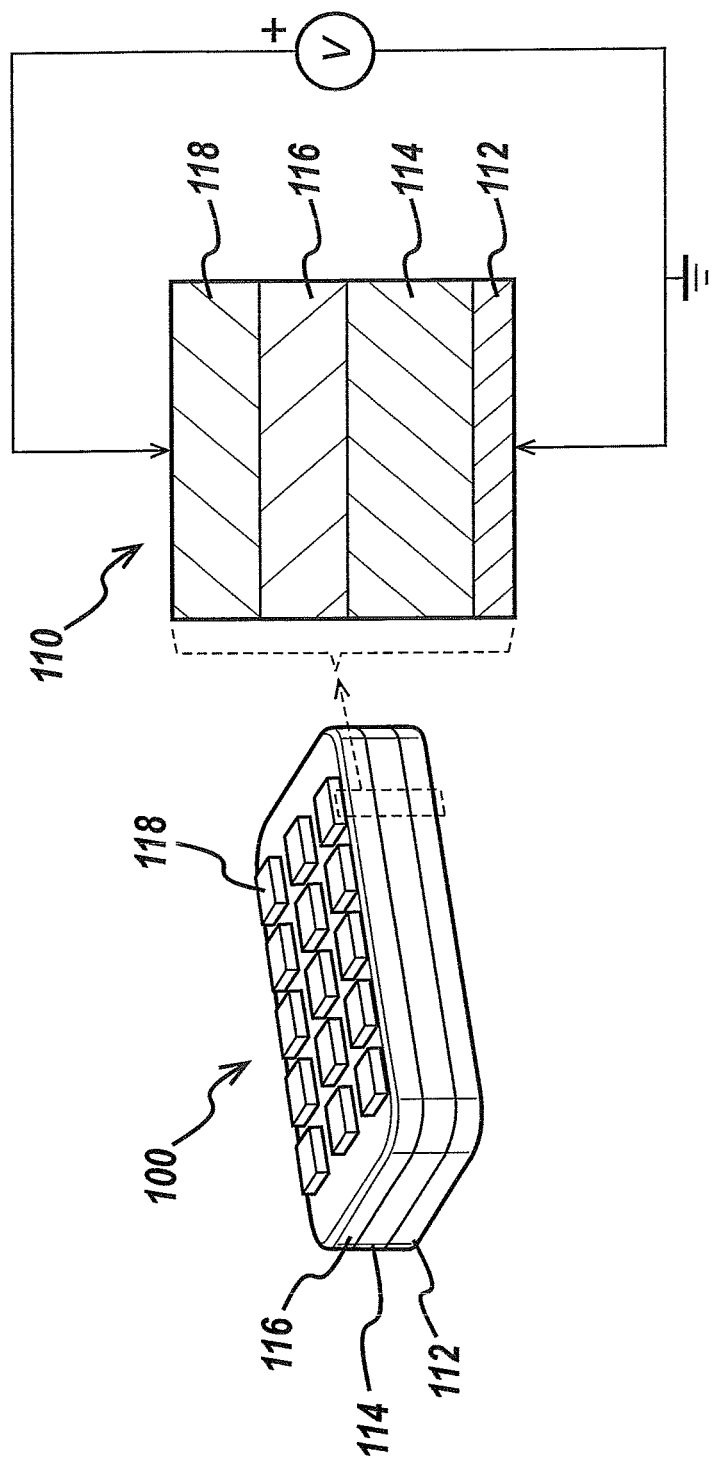

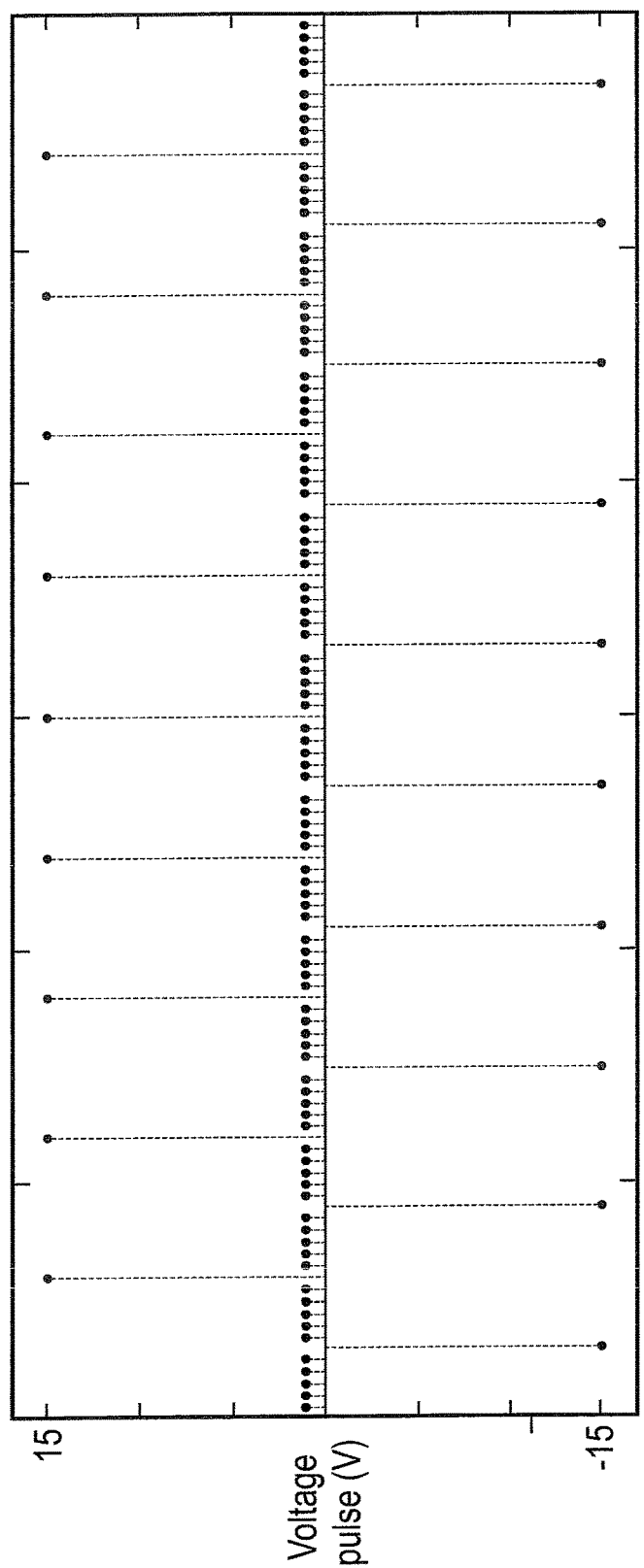

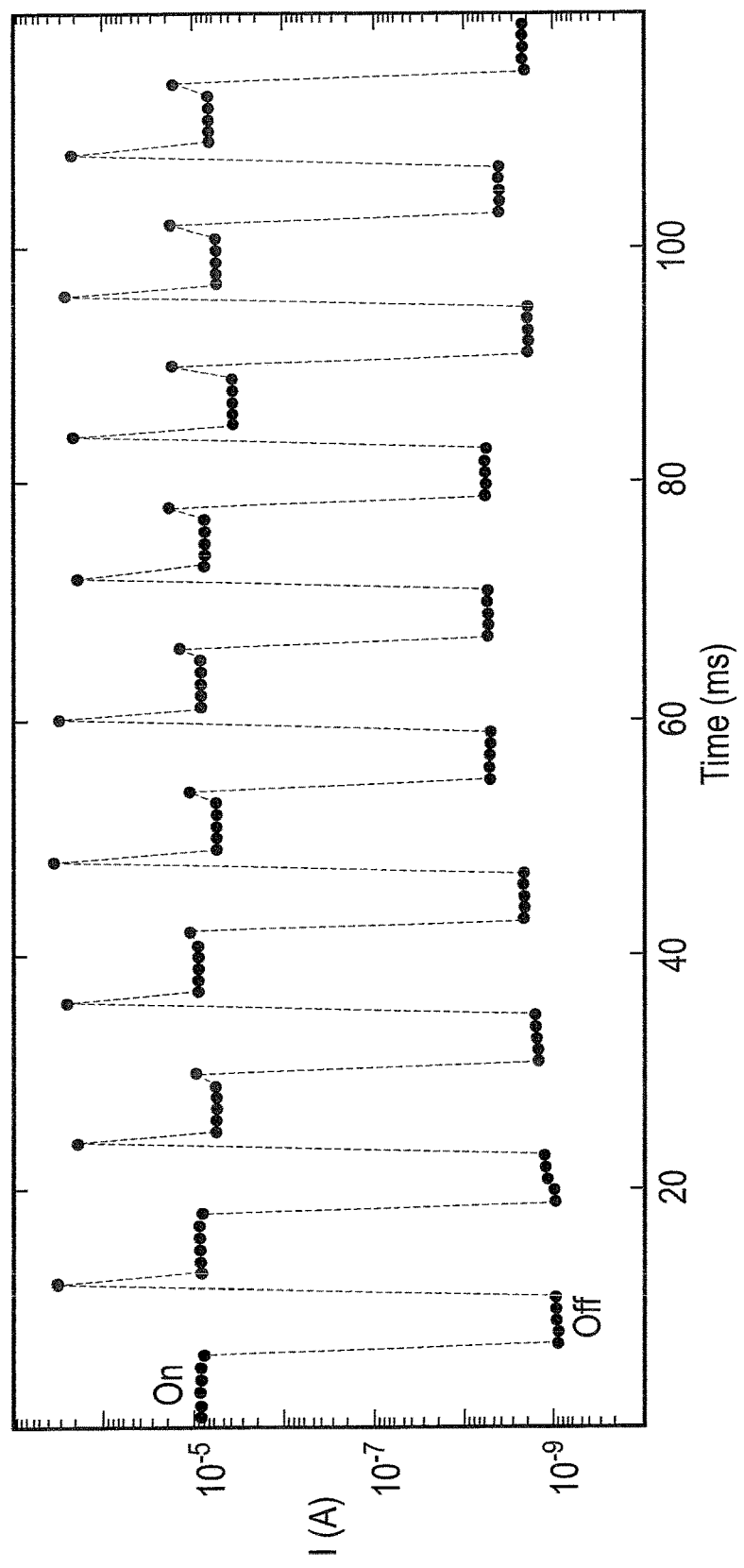
FIG. 4(c) contd.

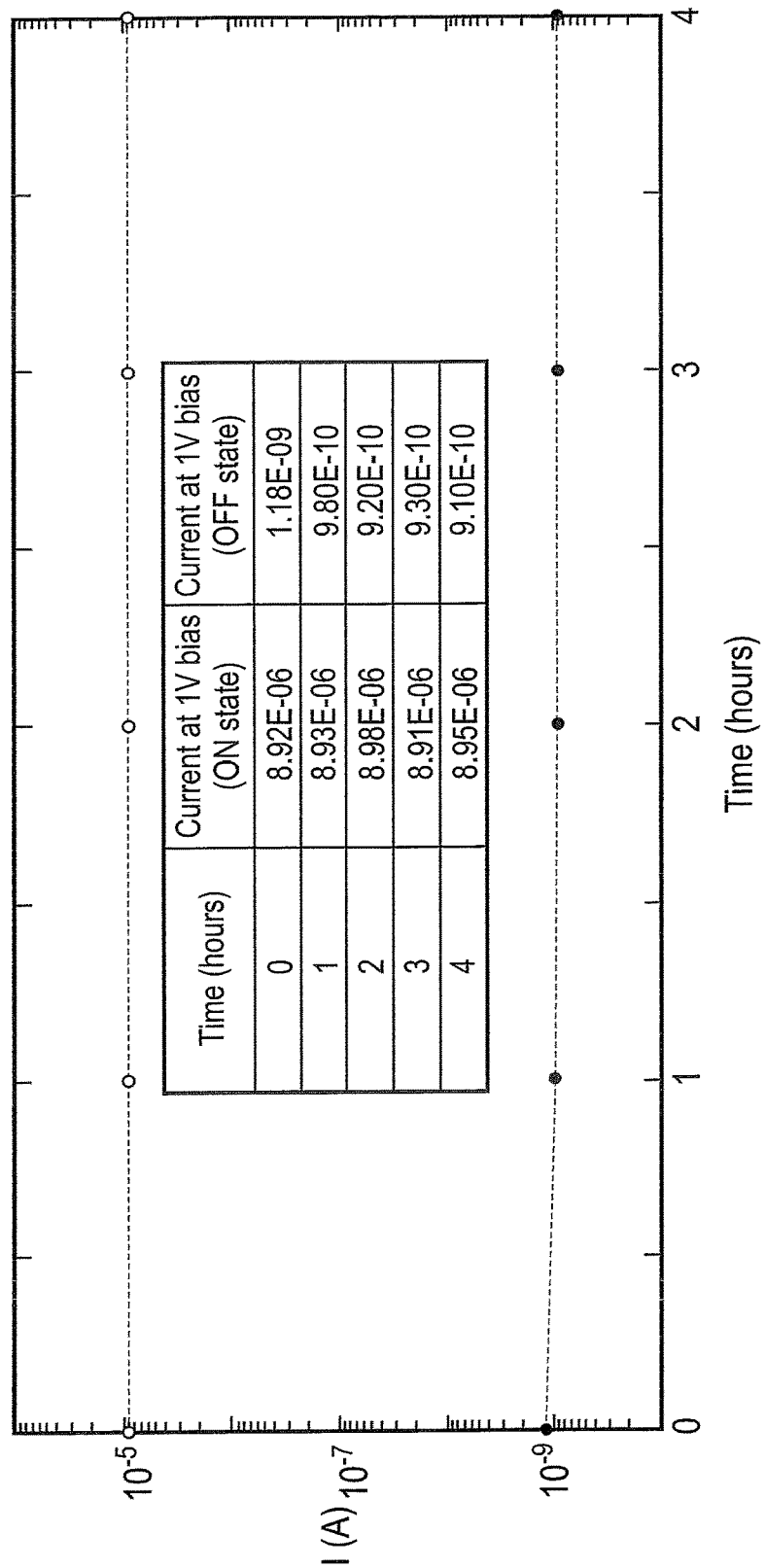

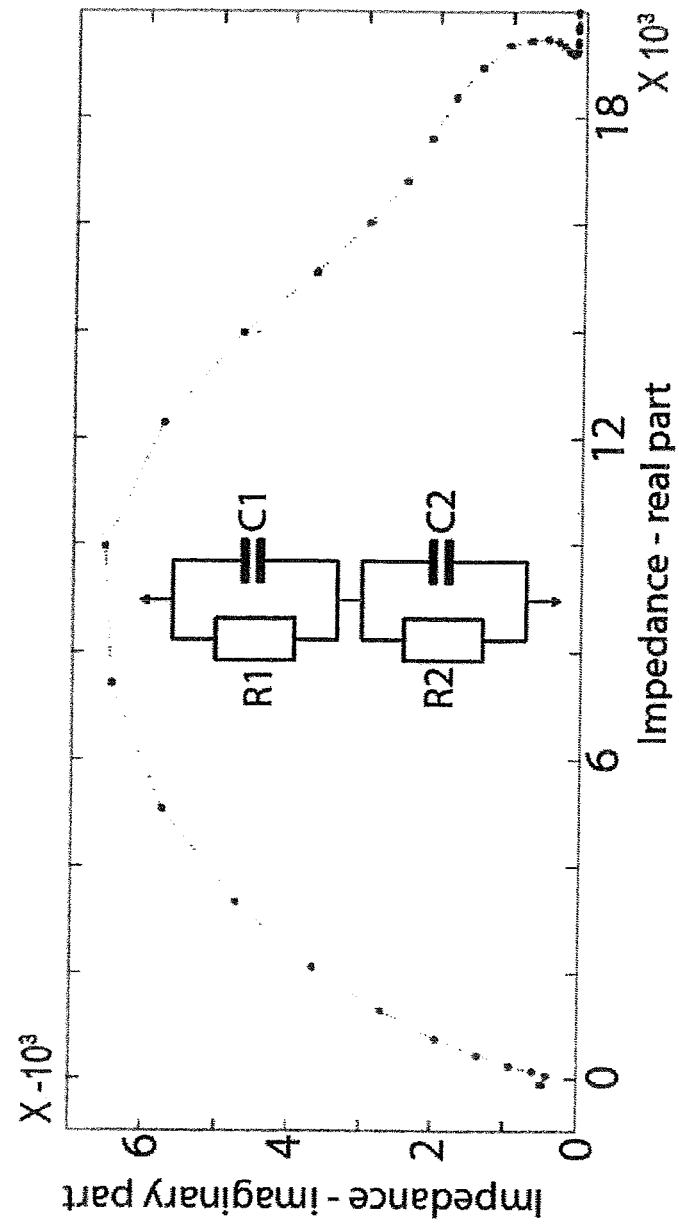

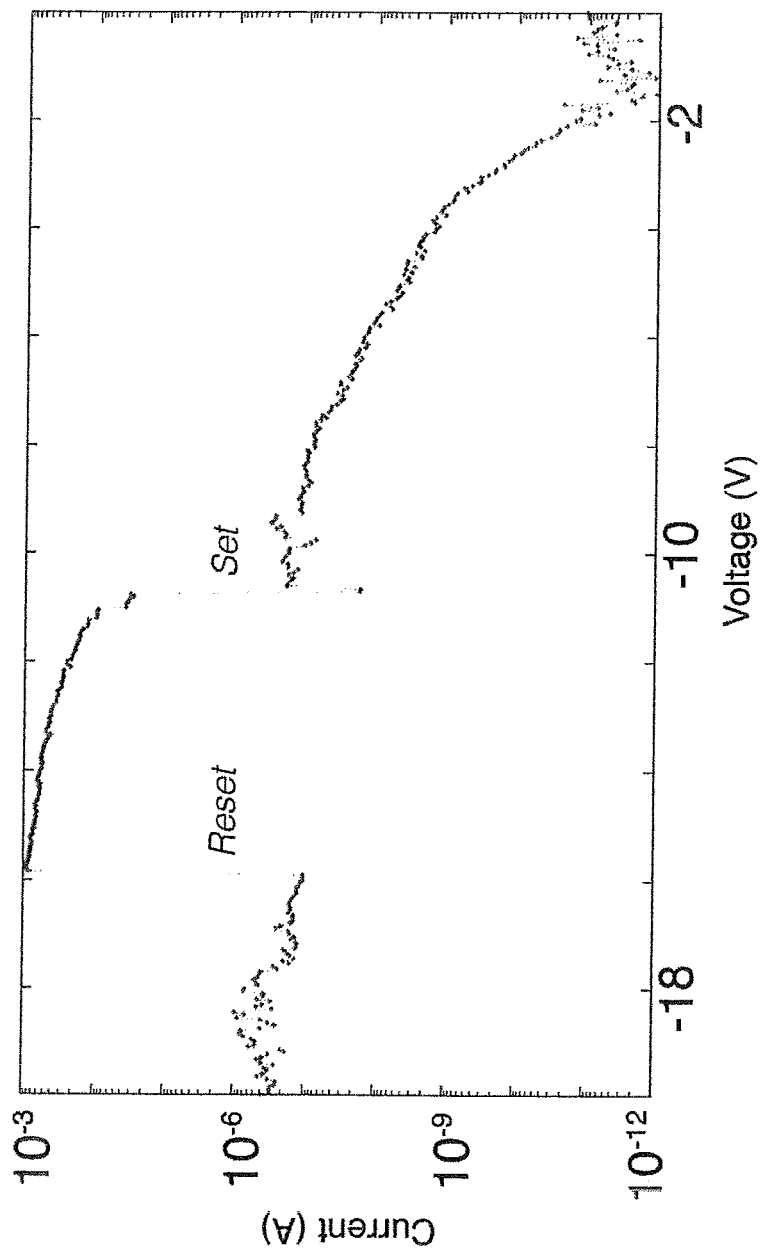

OXIDE MEMORY RESISTOR INCLUDING SEMICONDUCTOR NANOPARTICLES

CROSS-REFERENCE TO RELATED APPLICATIONS

This application is the National Stage of International Patent Application No. PCT/GB2012/051574 filed Jul. 5, 2012, which claims the benefit of United Kingdom Patent Application No. 1111513.6, filed Jul. 5, 2011, the disclosures of which are incorporated herein by reference in their entireties.

All documents cited herein are incorporated by reference in their entirety.

This invention concerns memory resistors. In particular, this invention concerns memory resistors that can be operated in ambient conditions. This invention also relates to arrays comprising such memory resistors and methods for making memory resistors.

Non-volatile memories based on resistive switching behaviour have attracted considerable attention over the past few years. In particular, two-terminal resistive switching elements known as memory resistors, or "memristors", have been put forward as the "missing" fourth passive circuit element. Memory resistors have the ability to remember their last resistance state even when there is no bias voltage applied and once the power has been switched off. The desirability of developing memory resistors has also been driven by the potential that they could offer a solution to the problem of decreased controllability of charges in conventional floating gate flash-based memories as device scaling is pushed to smaller dimensions.

A key property of memory resistors is that their resistance depends on their past history, opening up a wide range of potential applications beyond memories, including in neural networks and non-Boolean logic.

Memory resistors reported in the literature typically consist of multilayer structures in which conductive pathways are generated by the application of external fields. Strukov et al, Nature, 2008, 453, 80-83 discloses that titanium dioxide multilayers, in which the spatial distribution of oxygen ions is altered by an applied field, have exhibited memristor behaviour. However, these devices include metal electrodes and have conduction through metal filaments and so are not readily integrated into complementary metal oxide semiconductor (CMOS) fabrication processes.

There have also been reports of silicon-based devices. One approach by Yao et al, Nano Lett., 2010, 10, 4105-4110 and Yao et al, Appl Phys A, 2011, 102, 835-839 involves switching of conductive pathways along the surface of a $SiO_x$ pillar sandwiched between silicon contacts. These memory resistors comprise metal-free polySi/$SiO_x$/polySi vertical cell devices. Silicon filaments appear to form at the vertical $SiO_x$ edge. However, the memory resistors cannot be operated in ambient conditions because an oxygen environment apparently interferes with the reduction of $SiO_x$ to silicon, thereby hindering the formation of a silicon filament at the vertical $SiO_x$ edge. Furthermore, a vertical edge is required in such devices to form the silicon filament, thereby precluding the use of a continuous $SiO_x$ film. Alternative silicon-based devices disclosed by, for example, Do et al, Appl. Phys. 2009, Lett. 95, 093507 and US patent application 2010/0102290 A1 relate to the field-driven diffusion of silver ions from a top metal contact into an amorphous silicon layer and so are not readily integrated into CMOS fabrication processes.

There is a need for improved memory resistors. In particular, there is a need for memory resistors that are operational in ambient conditions and, preferably, for silicon-based memory resistors.

According to the present invention there is provided a memory resistor having an on state and an off state, comprising:
(a) a first electrode;
(b) a second electrode; and
(c) a dielectric layer disposed between the first and second electrodes;
wherein the dielectric layer comprises nanoparticles of semiconductor material, and wherein in the on state nanoparticles form at least one conductive filament encapsulated by the dielectric layer, thereby providing a conductive pathway between the first electrode and the second electrode.

The on state of the memory resistor is a state in which the memory resistor has low resistance, or impedance, relative to the off state.

The off state of the memory resistor is one in which the memory resistor has high resistance, or impedance, relative to the on state.

The resistance contrast between the on state and that of the off state is typically about 10 or more, preferably about 500 or more, preferably about 1000 or more, preferably about 5000 or more, preferably about 10000 or more, preferably about 50000 or more, more preferably about 100000 or more.

The memory resistor may be switched from the high resistance off state to the low resistance on state by applying a series of short voltage pulses in a predetermined order across the first and second electrodes. Generally, positive and negative bias (also referred to herein as positive and negative voltage, respectively) are applied to the second electrode. By applying a bias to the second electrode, the initial high impedance state (the off state) switches to a low impedance state (the on state) once a threshold voltage is reached and as a conductive filament is formed from semiconductor nanoparticles in the dielectric layer. This is the "set" process. The set process may be effected by applying either a positive or a negative bias to the second electrode. Applying a positive bias to the second electrode has an advantage of providing a more efficient set process because smaller current flows than in the negative bias arrangement. Furthermore, there is less likely to be a "reset" process caused by Joule heating from large currents.

Reducing the voltage below the threshold level does not switch the memory resistor to its initial off state, and the memory resistor now allows a larger current to flow.

Generally, the transition between the off state and the on state is abrupt and does not depend on the voltage sweep speed. The on state is stable and the memory resistor is able to stay in this state until a certain level of current is reached, which can be in either polarity. This is the "reset" process. The specific current level required to switch to the off state and hence to destroy the conductive filament depends on the particular material and parameters of the memory resistor but can be readily determined by performing current-voltage measurements.

Negative bias is preferred for switching to the off state as higher currents can be achieved with lower voltages than is the case in positive bias, thus enhancing conductive filament destruction over formation.

The formation ("set") process can be achieved again either in positive or in negative bias. However, for the set process, positive bias is preferred as high field with limited current minimizes conductive filament destruction and boosts formation.

Once the memory resistor is switched to one of the two states, the state is stable. Typically, the state persists for at least an hour, preferably at least 24 hours, preferably at least 48 hours, preferably at least a week, preferably at least a month, preferably at least a year, more preferably at least 10 years. The memory resistor can be cycled repeatedly between the on state and the off states in the manner described above.

The memory resistor has low energy consumption for switching, typically about 5 pJ per switch. Preferably, the energy consumption for switching is less than 5 pJ per switch, preferably 4 pJ or less, preferably 3 pJ or less, preferably 2 pJ or less, preferably 1 pJ or less.

The switching times of the memory resistor between the on and the off states, also known as switching pulses, are typically 200 ns or shorter, preferably 150 ns or shorter, preferably 100 ns or shorter, preferably 90 ns or shorter.

The memory resistor of the present invention can be cycled repeatedly between the on and the off states, typically 1000 or more times, preferably 2000 or more times, preferably 3000 or more times, preferably 4000 or more times, preferably 5000 or more times, preferably 10000 or more times.

The resistance properties of the memory resistor of the present invention are not affected by changing the dimensions of the memory resistor. Current does not scale with the size of the memory resistor. Consequently, the memory resistor may be scaled down in size to nanometre dimensions, for example the lateral dimensions (or "footprint") of the memory resistor may be 50 nm×50 nm or less, which has advantages of enabling very high density of memory resistors to be used and also enables very high levels of integration into electrical devices.

In this way, the memory resistor of the present invention may be used in memory applications, for example in non-volatile memory applications, such as flash memories and Dynamic Random Access Memories (DRAM).

Although the memory resistor of the present invention must have at least an on and an off state, the memory resistor may have three levels (or states) or more than three levels. In this way, the memory resistor may be useful in multi-level logic systems.

The dielectric layer may comprise any dielectric material suitable for use in a memory resistor, such as silicon oxide ($SiO_x$, where x does not equal 2 (non-stoichiometric silicon oxide)), silicon dioxide ($SiO_2$), silicon nitride, silicon carbide, silicon oxynitride, aluminium dioxide (alumina), germanium oxide, germanium nitride, gallium nitride, zinc oxide, and high-κ dielectrics such as hafnium dioxide, hafnium silicate, zirconium dioxide, and zirconium silicate. The dielectric material may be stoichiometric or non-stoichiometric. Preferably, the dielectric is silicon oxide, silicon nitride, silicon carbide or silicon oxynitride. Preferably, the dielectric is an oxide of silicon, preferably silicon dioxide or. The use of silicon-based compounds as the dielectric layer is advantageous because silicon compounds can be integrated more readily into CMOS processing.

The dielectric layer typically has a thickness of from about 3 nm to about 1 μm, preferably about 3 nm to about 200 nm, preferably about 15 nm to about 170 nm, preferably about 10 nm to about 50 nm.

The dielectric layer may adopt any structure suitable to allow nanoparticles to form a conductive filament when the memory resistor is in the on state. Without being bound by a particular theory, it is believed that the dielectric layer should be inhomogeneous. By "inhomogeneous" is meant herein that the dielectric material does not have a uniform structure but has at least two domains. The domains may have different degrees of defects or deficiency centres. The presence of at least two domains, or nano-scale columns within the dielectric layer, is important because the boundaries between these domains act as efficient nucleation centres for the formation of conductive pathways by nanoparticles of semiconductor material between the first and the second electrodes.

The dielectric layer may be deposited by any technique that allows a suitable structure to be formed. Sputtering, chemical vapour deposition (CVD), molecular beam epitaxy (MBE), metal-organic chemical vapour deposition (MOCVD), atomic layer deposition (ALD) and evaporation techniques may be used.

Preferably, the dielectric layer comprising nanoparticles of semiconductor material is deposited on the first electrode by sputtering as sputtering typically results in columnar growth of the dielectric layer and so layers produced in this way are not homogeneous. Preferably, the dielectric layer is deposited by magnetron sputtering. By "magnetron sputtering" is meant a process whereby atoms are ejected from a solid target material as a result of bombardment of the target by highly energetic particles. The ejected atoms can be then deposited onto a substrate, enabling the growth of a thin film. The term "magnetron sputtering" as used herein includes magnetron co-sputtering, wherein more than one atom type is used to form a thin film on a substrate.

Where techniques are used that would ordinarily produce highly homogeneous materials, such as CVD, MBE, MOCVD and ALD, steps are taken to reduce the level of homogeneity achieved.

The nanoparticles of semiconductor material may be: silicon; germanium; III-V compounds such as gallium arsenide, indium phosphide, indium gallium arsenide, and indium gallium arsenide phosphide; II-VI materials such as cadmium selenide, cadmium sulphide, and cadmium telluride. Preferably, the nanoparticles are silicon or germanium, preferably germanium. Preferably, when the dielectric material is a compound of silicon, the nanoparticles are silicon. The use of silicon nanoparticles has an advantage in that the memory resistor can be fabricated using conventional CMOS processing.

By "nanoparticle" is meant a particle that has nanometer scale dimensions, that is, having dimensions that typically range from about 0.5 nm up to about 100 nm. The nanoparticles of the semiconductor material typically have a particle size of from about 1 to about 15 nm, preferably from about 2 to about 10 nm. The nanoparticles may be amorphous or crystalline. Preferably, the nanoparticles are amorphous. The provision of amorphous nanoparticles in the dielectric layer may be achieved by processing at lower temperatures than would need to be used to form crystalline nanoparticles. Consequently, having amorphous nanoparticles allows easier incorporation of memory resistor device fabrication within existing processing techniques, for example CMOS processing.

The amount of nanoparticles present in the dielectric layer is that which is suitable for the memory resistor to be able to switch between the off and on states in the manner described previously. Typically, the average concentration of nanoparticles in the dielectric layer is from about $10^{16}$ cm$^{-3}$ to about $10^{18}$ cm$^{-3}$.

Nanoparticles may be introduced into the dielectric layer during growth, or deposition, of the dielectic material by, for example, implantation, sputtering, pulsed laser deposition and evaporation techniques. For example, during deposition of SiOx, where x<2, there is excess silicon which may be made to form nanoparticles during post-deposition annealing. Preferably, there is an excess of about 5 to about 10% silicon, preferably about 10% silicon.

The at least one conductive filament formed by nanoparticles of semiconductor material in the on state is encapsulated by the dielectric material. By "encapsulated" is meant herein that the conductive filament of nanoparticles is located within the bulk of the dielectric layer between the first and second electrodes and is not exposed to the ambient. In this way, the dielectric layer completely surrounds the conductive filament along its length and protects it from degradation caused by operation in ambient conditions, such as oxidation of the nanoparticle semiconductor material.

The first and second electrodes may be independently selected from any conventional electrode materials, such as silicon (polycrystalline or crystalline), indium tin oxide (ITO), graphene, zinc oxide, tin oxide, and metals such as gold, silver, copper aluminium and chromium. Preferably, at least one of the first and second electrodes is silicon. Preferably, the first electrode and the second electrode are both silicon.

In fabrication of the memory resistor, the first electrode may be formed on a suitable substrate and the second electrode may be formed on the dielectric layer using conventional deposition technology, such as sputter deposition, evaporation, vapour deposition and lithographic processes.

The shape and size of the electrodes may be modified to form appropriate electrical contacts using techniques such as photolithography and plasma etching. Typical contact sizes are from about 50 nm$^2$ to about 6 mm$^2$, preferably from about 50 nm$^2$ to about 200 nm$^2$. In particular, the size of the second electrode may be modified in this way in order to define the size of the memory resistor device. This is particularly important when making an array of memory resistors of the present invention.

The first and second electrodes may have p-type doping or n-type doping. There may be asymmetry in the doping of the electrodes such that either the first electrode is p-doped and the second electrode is n-doped or the first electrode is n-doped and the second electrode is p-doped. Such an arrangement of asymmetric doping polarities has an advantage of enabling there to be two bias regimes in the memory resistor whereby, for example, applying a negative potential to the n-type second electrode shifts the work function allowing a higher current to flow, while a positive potential applied to the n-type second electrode results in a lower current.

Having differently doped first and second electrodes offers added functionality over symmetric structures by allowing clear differentiation between the two operating polarities. In inversion (for example, positive potential on an n-type second electrode; p-type first electrode grounded) small currents flow because the interface region of the first electrode is depleted of majority carriers. This allows high fields to be applied to programme the memory resistor without large currents. In accumulation (for example negative potential to an n-type second electrode; p-type first electrode grounded) the memory resistor can be switched off with a lower voltage than would be required in inversion as larger currents can flow for smaller applied potentials as the interface region is now flooded with potential carriers. Thus, having asymmetry in the polarities of the electrodes makes the memory resistor more stable.

Preferably, the first electrode is n-doped silicon and the second electrode is p-doped silicon. Alternatively, the first electrode is p-doped silicon and the second electrode is n-doped silicon. These arrangements have an advantage in that the use of silicon enables the memristors to be fabricated by CMOS processing. Furthermore, the asymmetric doping provides the memory resistor with improved properties. In particular, the asymmetric structure allows two regimes for operation of the memory resistor, namely high field and low current or high field and high current. These two regimes enable accurate and fast programming of the memory resistor.

The first and second electrodes are typically about 10 nm to about 1 μm thick, preferably about 50 nm to about 500 nm thick.

According to the present invention there is also provided an array comprising at least one of the memory resistors defined herein. Such arrays have an advantage in that they can be operated in ambient conditions.

Each of the memory resistors in the array may be independently electrically addressable. The array may comprise a crossbar arrangement of memory resistors.

According to the present invention there is also provided a method for making a memory resistor having an inhomogeneous dielectric layer comprising nanoparticles of semiconductor material, comprising:

(a) providing a first electrode;
(b) depositing a dielectric layer comprising semiconductor material on the first electrode; and
(c) depositing a second electrode over the dielectric layer.

The first and second electrodes, the dielectric layer, and the nanoparticles of semiconductor material are as hereinbefore described.

The dielectric layer may be deposited by any technique that allows a suitable structure to be formed, that is, the dielectric layer must be inhomogeneous. Sputtering, chemical vapour deposition (CVD), molecular beam epitaxy (MBE), metal-organic chemical vapour deposition (MOCVD), atomic layer deposition (ALD) and evaporation techniques may be used.

Preferably, the dielectric layer comprising nanoparticles of semiconductor material is deposited on the first electrode by sputtering as sputtering typically results in columnar growth of the dielectric layer and so layers produced in this way are not homogeneous. Preferably, the dielectric layer is deposited by magnetron sputtering.

Where techniques are used that would ordinarily produce highly homogeneous materials, such as CVD, MBE, MOCVD and ALD, steps are taken to reduce the level of homogeneity achieved or to allow the inclusion of defects. The particular steps required will vary depending on the specific experimental set up but may include annealing and the deliberate introduction of gases such as hydrogen during growth.

For example, plasma-enhanced chemical vapour deposition (PECVD) can be used to deposit an inhomogeneous silicon oxide layer comprising excess silicon by using silane (SiH$_4$) as the silicon precursor, thereby producing films that are hydrogen-rich. On annealing at temperatures above about 500° C., the hydrogen is removed, creating dangling bonds in the film that may be compensated by interstitial atoms and which may lead to very high film stress. The more silicon-rich the silicon oxide layer, the more hydrogen is incorporated and the more stress and defects are introduced.

In some embodiments, the method comprises an annealing step. Preferably, the annealing step is carried out prior to deposition of the second electrode. In some embodiments, an annealing step is required to turn a homogeneous dielectric layer into an inhomogeneous layer. Independently, an annealing step may be required to cause the semiconductor material deposited with the dielectric layer to form nanoparticles.

Preferably, annealing is performed in a non-oxidizing atmosphere, such as in an inert gas (for example Ar or $N_2$), in a vacuum, or in a forming gas (such as a mix of $H_2$ and $N_2$) that passivates dangling bonds with hydrogen. Any suitable annealing technique may be used, such as furnace annealing or rapid thermal annealing The annealing temperature is selected depending on the particular combination of dielectric material and semiconductor material used. If amorphous nanoparticles are desired, an annealing temperature is selected below the temperature at which the semiconductor material would form crystalline nanoparticles. For example, where the dielectric layer comprises silicon oxide deposited by sputtering and the semiconductor material is silicon, annealing at about 900° C., preferably at about 700° C., preferably at about 500° C. may be carried out to form amorphous silicon nanoparticles from excess silicon contained within the dielectric layer. In another example, where silicon dioxide is deposited by sputtering and the semiconductor material is germanium, no annealing may be required to form an inhomogeneous dielectric layer and amorphous germanium nanoparticles.

The method of the present invention enables formation of improved memory resistors, which may be operated in ambient conditions.

The term "comprising" means "including" as well as "consisting" e.g. a composition "comprising" X may consist exclusively of X or may include something additional e.g. X+Y.

The term "about" in relation to a numerical value x means, for example, x±10%.

The word "substantially" does not exclude "completely" e.g. a composition which is "substantially free" from Y may be completely free from Y. Where necessary, the word "substantially" may be omitted from the definition of the definition.

Specific embodiments of the present invention are now described, by way of example only, with reference to the accompanying drawings in which:

FIG. 1 shows a cross-sectional diagram of a memory resistor of the present invention;

FIGS. 2(a) to (c) show a series of schematic diagrams illustrating the set and reset processes in a memory resistor of the present invention;

FIG. 3 shows an experimental set-up including a cross-section of a memory resistor of the present application;

FIGS. 4(a) and (b) show current-voltage characteristics for positive and negative bias in a memory resistor of the present invention;

Figure 7B:
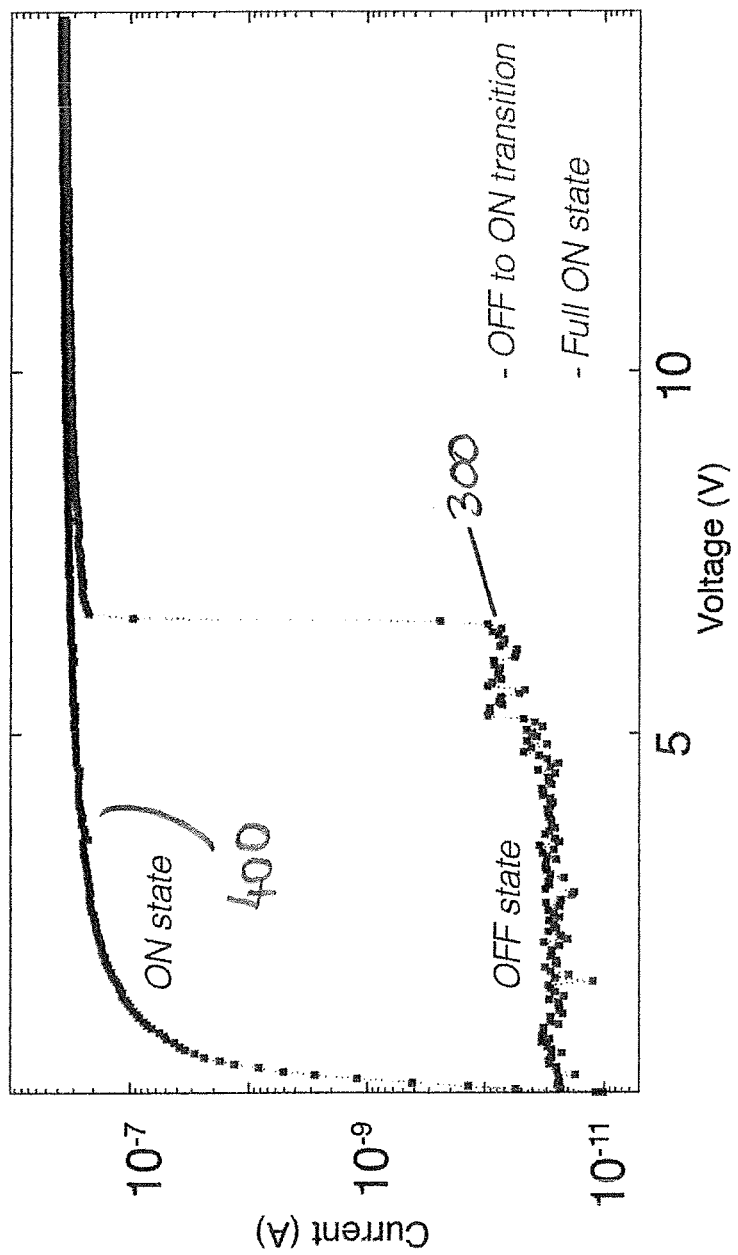
FIG. 7(a) shows current-voltage characteristics in negative bias showing unipolar switching.
Figure 7C:
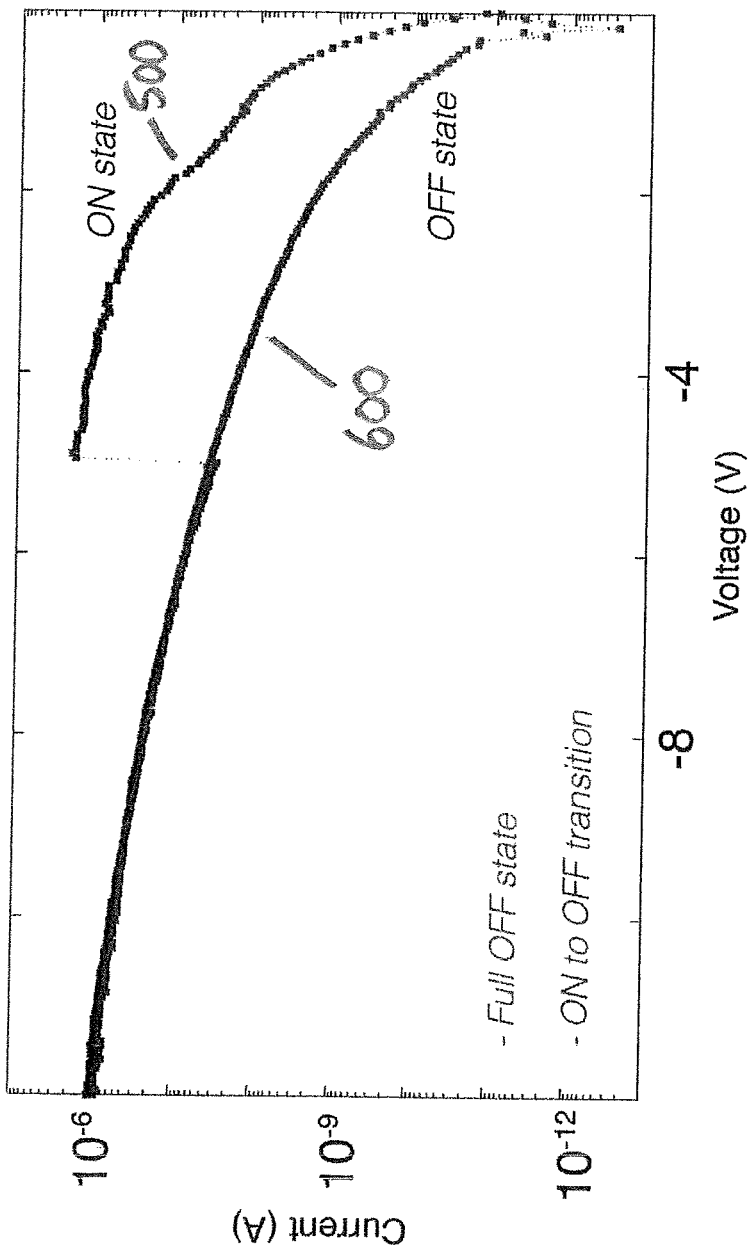
Figure 7D:
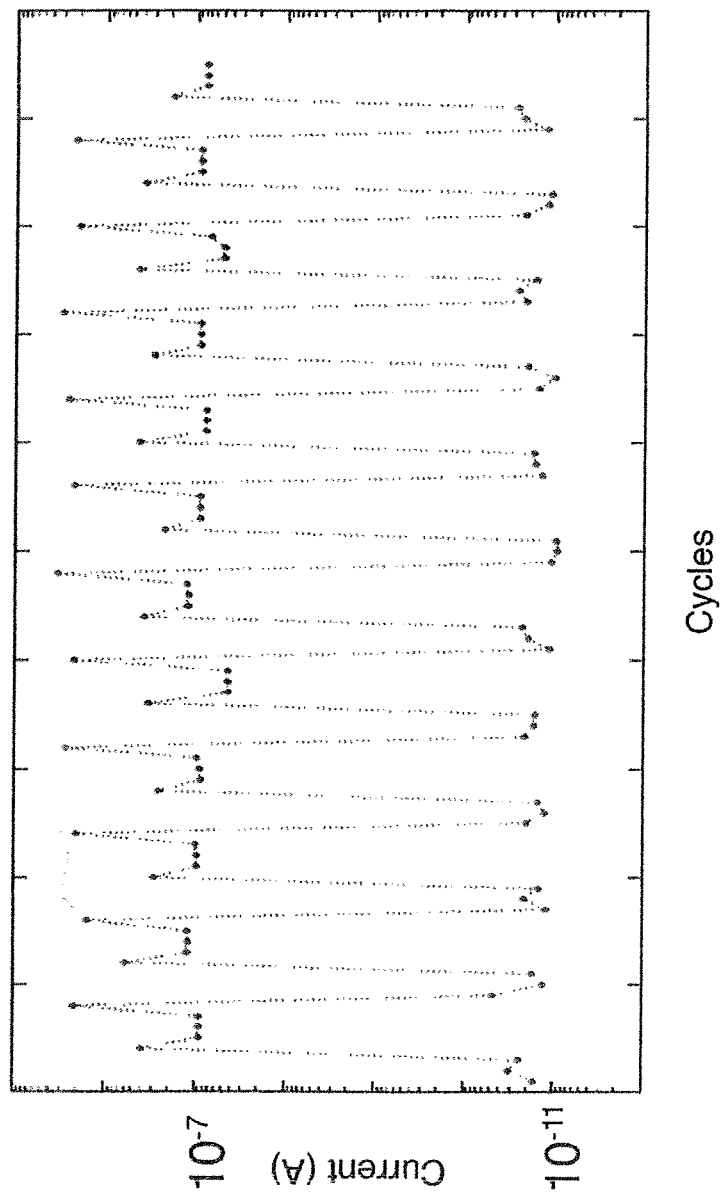

FIGS. 7(b) and (c) show current-voltage characteristics for positive and negative bias in a memory resistor of the present invention;

FIG. 7(d) shows sequential cycling between the off and on states of a memory resistor of the present invention;

FIGS. 8 (a) and (b) show current-voltage graphs under positive bias and negative bias, respectively; and FIGS. 8 (c) and (d) show current-time graphs under a constant voltage bias of −8V and −10V, respectively.

FIGS. 1 and 2(a) to (c) show cross sections of a memory resistor (10) of the present invention. The memory resistor (10) comprises a first electrode (2), a dielectric layer (4) containing nanoparticles of semiconductor material (not shown in FIG. 1) and a second electrode (6). By forming electrical connections (14) to the first electrode (2) and the second electrode (6), the second electrode (6) can be biased to provide a series of potential differences the dielectric layer (4), allowing the memory resistor (10) to be cycled between an off state and an on state, as required.

Figure 1:
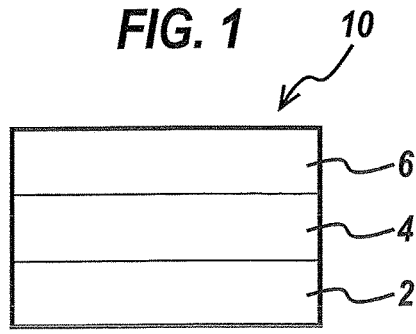
Figure 2:
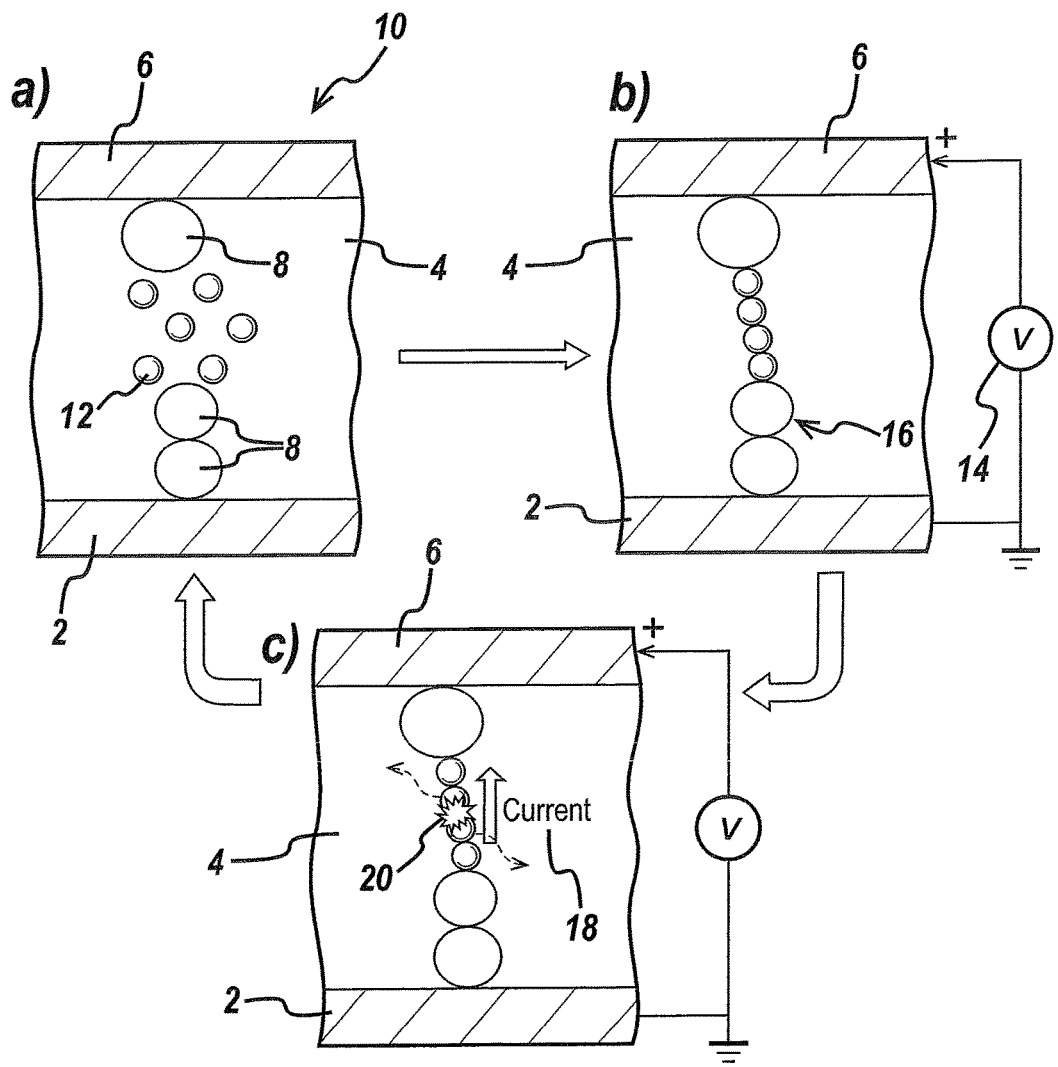

In the on state, nanoparticles of semiconductor material form a conductive filament. FIGS. 2(a) to (c) show a series of schematic diagrams illustrating a possible process for the formation of a conductive filament (16) in the memory resistor (10). The memory resistor (10) in FIG. 2(a) is in the off state, where resistance is high relative to the on state and where there is no conductive filament in the dielectric layer (4). Without being bound by theory it is believed that the dielectric layer may contain large semiconductor clusters (8) having a size of about 2 nm or more and small semiconductor particles (12) having a size of <1 nm. On the application of an applied field (14) across the dielectric layer (4), the small semiconductor particles (12) migrate and form a conduction bridge between larger semiconductor clusters (8), thereby forming a conduction filament (16) encapsulated by the dielectric layer (4). The memory resistor (10) in FIG. 2(b) is in the on state. A possible mechanism for the formation of conductive filaments is DC dielectrophoresis. Applying a DC electric field across the dielectric layer (4) produces an induced dipole in the semiconductor nanoparticles (12) within the dielectric layer (4). Given sufficient mobility of semiconductor nanoparticles and a non-uniform field, these nanoparticles interact through dipole-dipole interactions and faun chains (16). As shown in FIG. 2(c), when a high current (18) is passed through the memory resistor (10) destruction of the conductive filament (16) occurs. This returns the memory resistor (10) to the off state as shown in FIG. 2(a). Without being bound by theory it is believed that destruction of the conductive filament (16) is driven by Joule heating (20) due to the high current (18). The memory resistor (10) can be cycled between the on and off states by repeating the steps illustrated in FIGS. 2(a) to (c).

FIG. 3 shows an array (100) of memory resistors (110) of the present invention. The array (100) is supported on a substrate (112) which can be an electrical contact, such as an Au—Cr contact. The first electrode (114) and the dielectric layer (116) containing semiconductor nanoparticles form continuous layers over the contact (112). A pattern of second electrodes (118) is deposited in order to make an array of memory resistors (110).

EXAMPLE 1

A memory resistor is made by depositing a 37 nm thick layer of silica containing about 5-10% excess silicon onto a layer of p-type (boron doped) silicon. The silica layer is deposited by magnetron co-sputtering using two confocal cathodes, a pure Ar plasma and $SiO_2$ and Si targets.

The layers are annealed for about 1 hour in nitrogen at 900° C. to form nanometre-sized particles of silicon having an average diameter of about 2 to about 3 nm from the excess silicon. Layer thicknesses are measured using ellipsometry. X-ray photoelectron spectroscopy (XPS) measurements from a Perkin-Elmer PHI-5500 instrument using $Ar^+$ ion beam at 4 keV are performed to characterize the amount of excess silicon.

A top electrode structure of either 60 nm indium tin oxide (ITO) is deposited by low pressure chemical vapour deposition (LPCVD) onto the layer of silica.

Contacts are deposited underneath the first electrode by successive evaporation of gold and chromium.

EXAMPLE 2

Figure 4A:
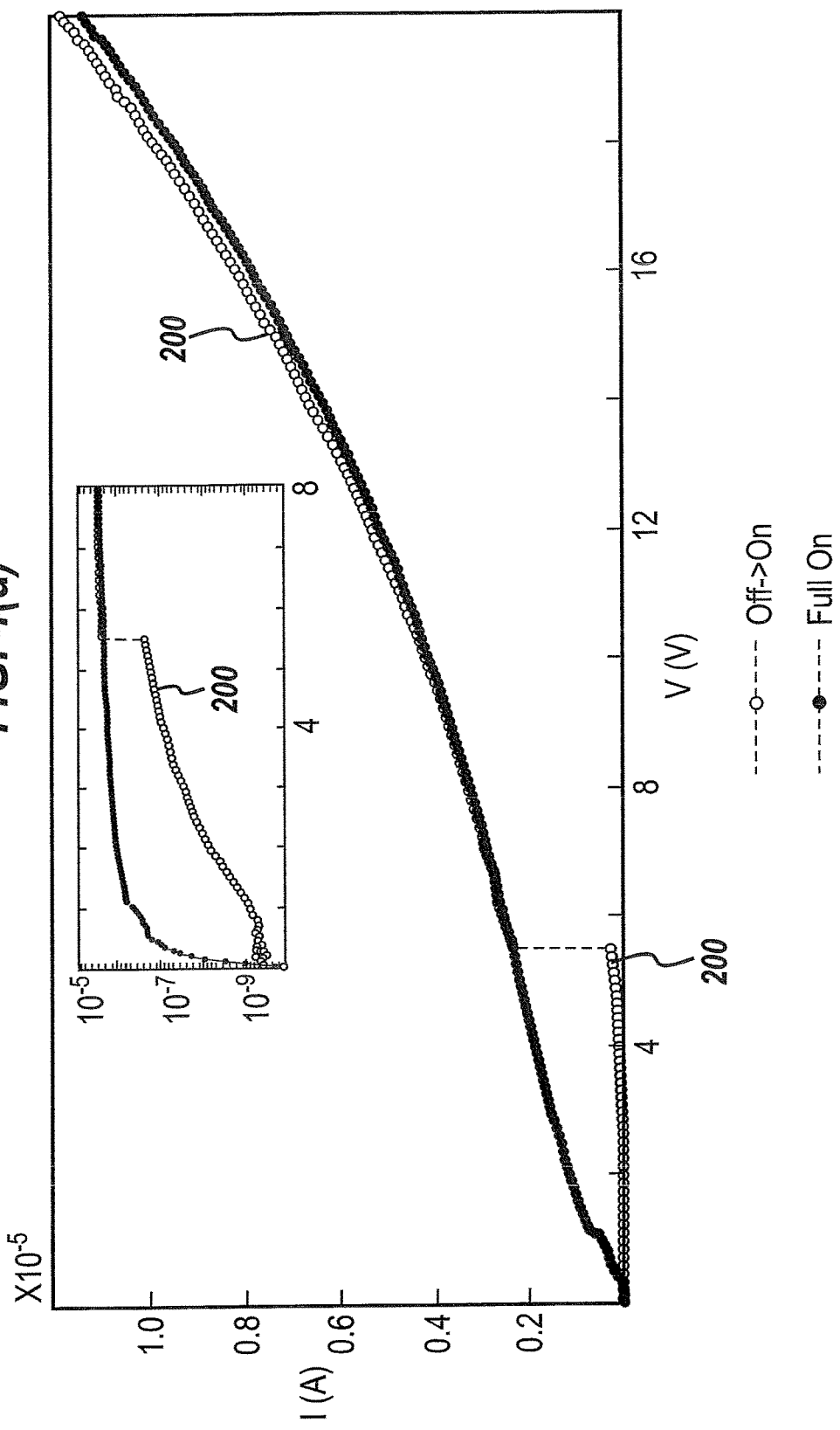
FIG. 4(c) shows sequential cycling between the off and on states of a memory resistor of the present invention.
FIG. 4(d) shows retention times for the off and on states of a memory resistor of the present invention.

Results of current-voltage measurements performed on the memory resistor prepared in Example 1 using a Keithley 4200-SCS semiconductor Characterization System and a Signatone probe station are shown in FIGS. 4(a) and (b), along with insets showing a logarithmic representation.

All measurements were performed in ambient conditions in an open laboratory.

Figure 4B:
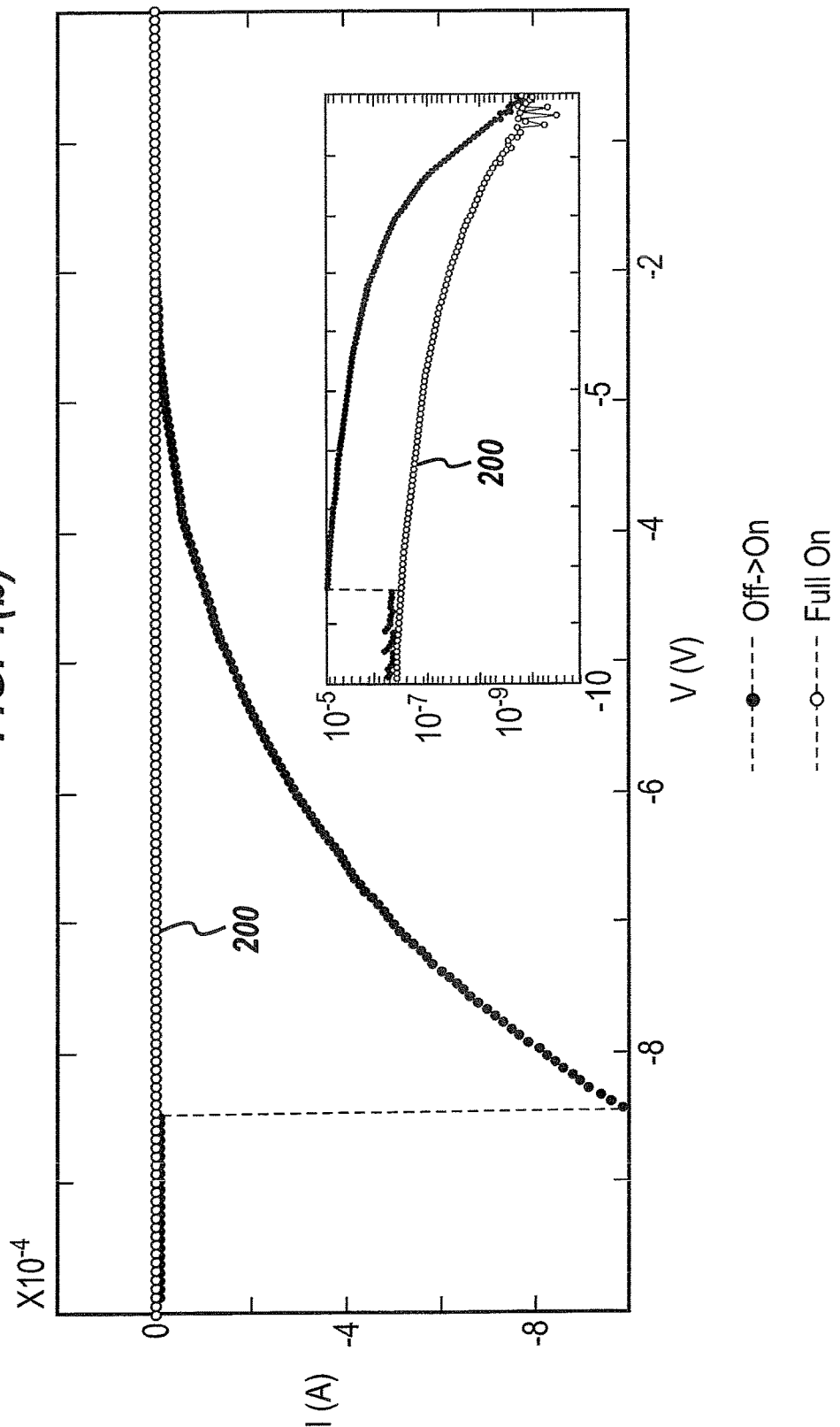

There is evidence of hysteresis in both positive (FIG. 4(a)) and negative (FIG. 4(b)) bias (positive and negative voltage, respectively) applied to the top electrode. Under positive bias, the initial high impedance state (the off state) switches to a low impedance state (the on state) once a threshold voltage is reached (shown by lines with unfilled circles (200)). It is evident that reducing the voltage below the threshold level does not switch the device to its initial state, and the device now allows a much larger current to flow (line with filled circles). The transition between high and low resistance states is abrupt and does not depend on the voltage sweep speed. The low impedance state is stable, and the device stays in this state until a certain level of current is reached. A prompt drop in current can be seen in FIG. 4(b) (line with filled circles) when the required current level is reached under negative bias.

The switching processes are repeatable and the states are stable. The memory resistors are stable in both states for at least 48 hours and no degradation is observed in the resistive behaviour of the devices. FIG. 4(d) shows retention times for both on and off states tested by +1V pulse over a 4 hour period.

FIG. 4(c) shows the results of sequential cycling between the off and the on states, which is relevant to the application of memory resistors to device programming Short (5 ms) voltage pulses of +15V, −15V and +1V are used for setting, resetting and reading, respectively. A voltage of +1V pulse is used for reading as this does not affect the memory resistor state. The upper trace shows the sequence of programming and read voltages and the lower trace shows the resultant device currents. The memory resistors are stable when subjected to at least 4000 programming cycles.

The resistive switching processes displayed by the memory resistor are attributed intrinsically to the silicon-rich silica layer. Filament formation driven by ion diffusion from the ITO contacts is ruled out as ITO can be used as an effective diffusion barrier. Furthermore, the set/reset process is not dependant on bias polarity, which excludes the possibility that conduction is driven by the migration of a single charged species. In addition, measurements performed on samples fabricated with both an ITO top electrode and an n-type silicon top electrode contact show similar behaviour of clear controllable switching.

EXAMPLE 3

Figure 5A:
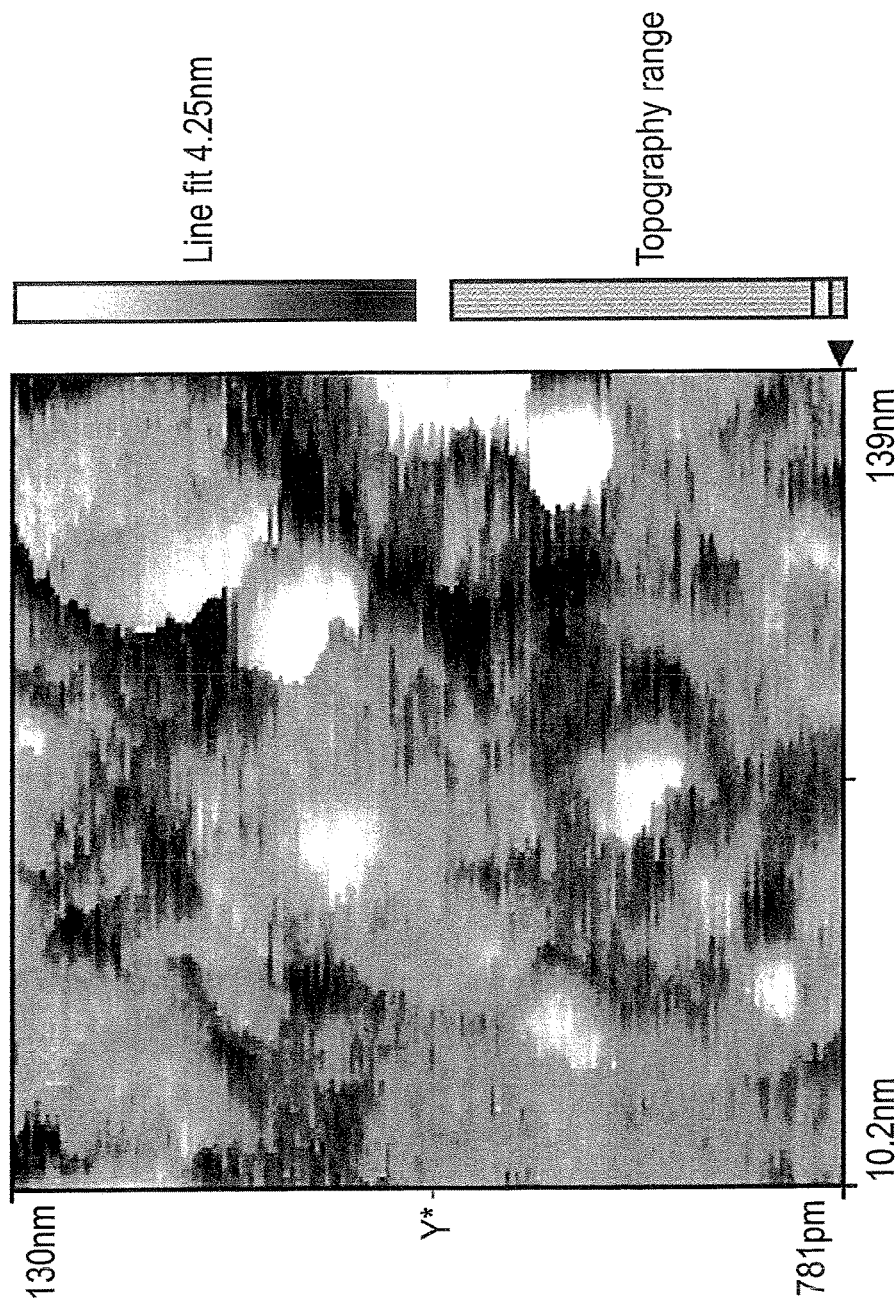
FIG. 5(a) shows an STM image of the surface of a memory resistor of the present invention showing individual conductive pathways.

Scanning Tunnelling Microscopy (STM) of an area of the sample away from the top electrode of the ITO electrode memory resistor prepared in Example 1 is shown in FIG. 5(a). Light areas correspond to individual conductive pathways (that is, single conductive filaments). IV characteristics of the light and dark areas on the STM image confirm that dark areas have very high resistance, exhibiting dielectric-like behaviour, while light areas exhibit semiconductor-like conductivity.

Figure 5B:
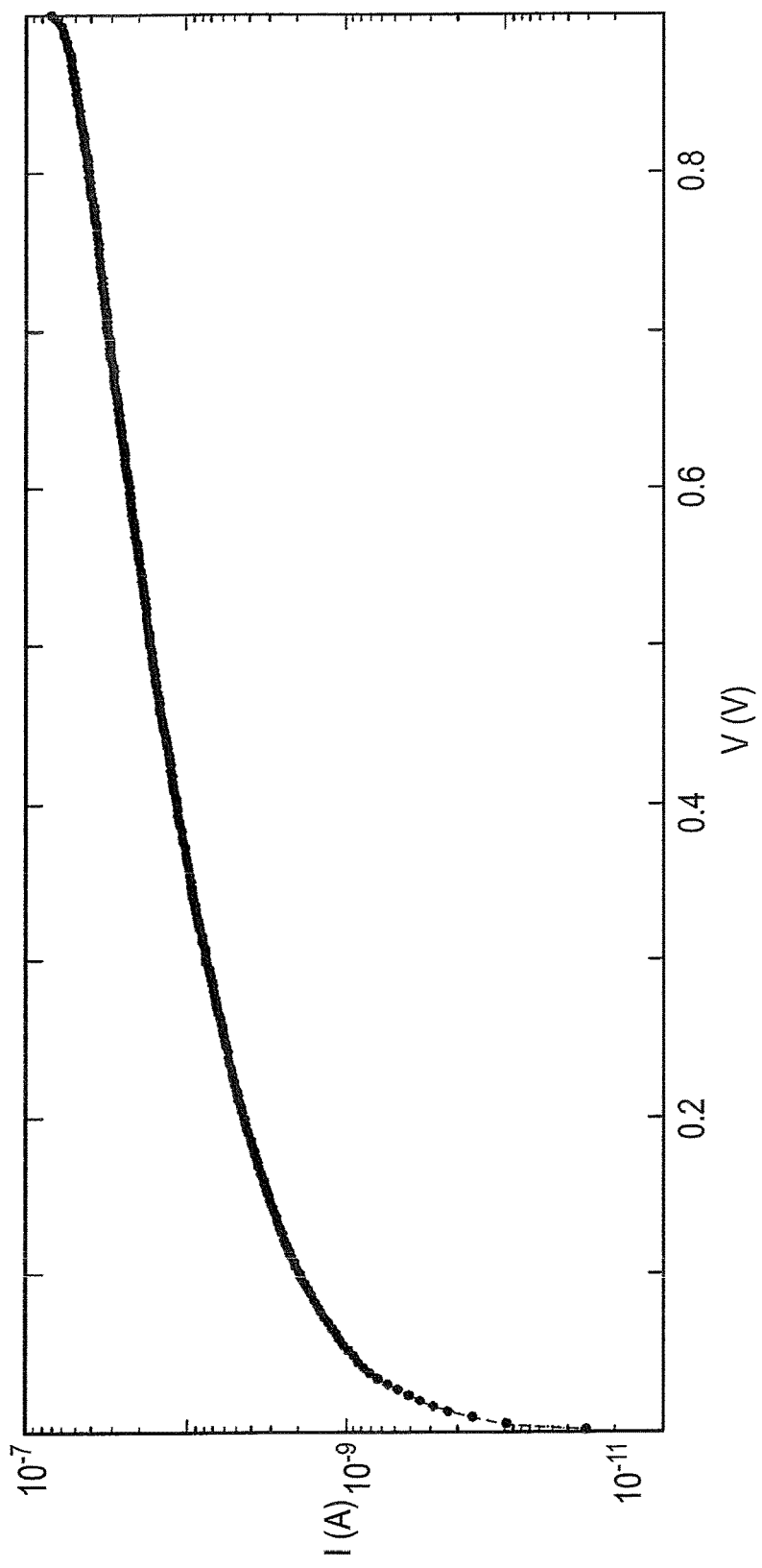
FIG. 5(b) shows a current-voltage curve obtained with the STM tip on one of the bright areas on FIG. 5(a)

FIG. 5b shows a typical IV curve from one of the light areas. Such conductive pathways are of the order of 10 nm in diameter, suggesting that memristive devices based on the memory resistors of the present invention may be scaled down to the nanometre scale to achieve very high levels of integration.

EXAMPLE 4

Figure 6A:
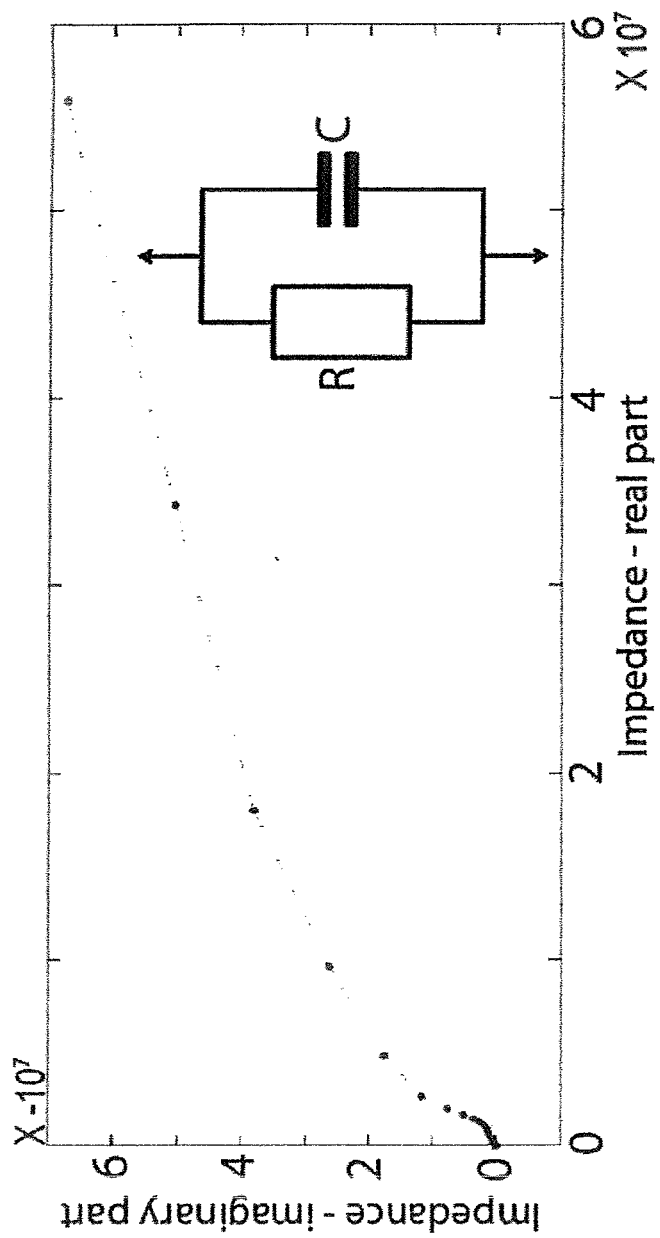
FIG. 6 shows Cole-Cole plots with theoretical models under 1V in (a) the off state and (b) the on state.

Impedance Spectroscopy measurements performed on the memory resistor of Example 1 using a 1V sine-wave bias at frequencies up to $10^7$ Hz show a clear difference between the device in the high and low resistance state. In the off state (see FIG. 6(a)), the fitted model suggests an equivalent circuit model with a single parallel capacitor and resistor ($R=2.07 \times 10^8 \Omega$ and $C=4.64 \times 10^{-10}$ F). In the on state (see FIG. 6(b)), there are two small semi-circles, suggesting a model with additional parallel resistors and capacitors in series ($R1=1.74 \times 10^4 \Omega$, $C1=1.09 \times 10^{-10}$ F. and $R2=1.33 \times 10^3 \Omega$, $C2=3.27 \times 10^{-8}$ F).

The results are consistent with the formation and destruction of conductive pathways. In the off state, the device appears to behave as a single MOS structure with carrier transport predominantly by Fowler-Nordheim tunnelling between the top and bottom electrodes, while in the on state a continuous chain of nanoparticles allows transport via Poole-Frenkel hopping or trap-assisted tunnelling between adjacent nanoparticles.

EXAMPLE 5

A memory resistor is made by depositing a 37 nm thick layer of silica containing about 5-10% excess silicon onto a layer of p-type (boron doped) silicon. The silica layer is deposited by magnetron co-sputtering using two confocal cathodes, a pure Ar plasma and $SiO_2$ and Si targets.

The layers are annealed for about 1 hour in nitrogen at 900° C. to form nanometre-sized particles of silicon (silicon nanoclusters) having an average diameter of about 2 to about 3 nm from the excess silicon. Layer thicknesses are measured using ellipsometry. X-ray photoelectron spectroscopy (XPS) measurements from a Perkin-Elmer PHI-5500 instrument using $Ar^+$ ion beam at 4 keV are performed to characterize the amount of excess silicon.

A top electrode of 200 nm n-type (P-doped) polycrystalline silicon, having a sheet resistance of 1 $\Omega mcm^{-1}$, is deposited by low pressure chemical vapour deposition (LP-CVD) onto the layer of silica. The resulting memory resistor has an asymmetric structure in that the doping of the first electrode (p-type) and the second electrode (n-type) are of opposite polarities, allowing the definition of accumulation and inversion bias regimes in the MOS structure.

The polycrystalline silicon top electrode contact is defined using photolithography and plasma etching to be about $10^{-4}$ mm$^2$ in size.

Contacts are deposited underneath the first electrode by successive evaporation of gold and chromium.

EXAMPLE 6

Results of current-voltage measurements performed on the memory resistor prepared in Example 5 using a Keithley 4200-SCS semiconductor Characterization System and a Signatone probe station are shown in FIGS. 7(a) to (c) and FIGS. 8(a) and (b). Results of the current variation with switching cycles are shown in FIG. 7(d). Results of the current variation with time under a constant voltage bias of −8V and −10V are shown in FIGS. 8(c) and (d).

All measurements were performed in ambient conditions in an open laboratory.

The current-voltage graph in FIG. 7(a) in negative bias shows unipolar switching. There is evidence of hysteresis in both positive (FIG. 7(b)) and negative (FIG. 7(c)) bias (positive and negative voltage, respectively) applied to the top electrode. Positive bias is an inversion regime whereas negative bias is an accumulation regime. Under positive bias (inversion), the initial high impedance state (the off state) switches to a low impedance state (the on state) once a threshold voltage is reached (line (300) in FIG. 7(b)). It is evident that reducing the voltage below the threshold level does not switch the device to its initial state, and the device now allows a much larger current to flow (line 400 in FIG. 7(b)). The transition between high and low resistance states is abrupt and does not depend on the voltage sweep speed. The low impedance state is stable, and the device stays in this state until a certain level of current is reached, which can be in either polarity. A prompt drop in current can be seen in FIG. 7(c) (line 500) when the required current level is reached under negative bias.

The formation (set) process is achievable again either in inversion or accumulation and the switching process is intrinsically unipolar as seen in FIG. 7(a).

The switching processes are repeatable and the states are stable. The memory resistor is stable in both states for at least 72 hours and no degradation is observed in the resistive behaviour of the device.

FIG. 7(d) shows the results of sequential cycling between the off and the on states, which is relevant to the application of memory resistors to device programming. Short (5 ms) voltage pulses of +15V, −15V and +1V are used for setting, resetting and reading, respectively. A voltage of +1V pulse is used for reading as this does not affect the state of the memory resistor. Programming is achieved using 10V pulses as short as 90 ns. The switching energy is calculated to be no higher than 2 pJ/bit. The memory resistor is stable when subjected to at least 4000 programming cycles.

Figure 8A:
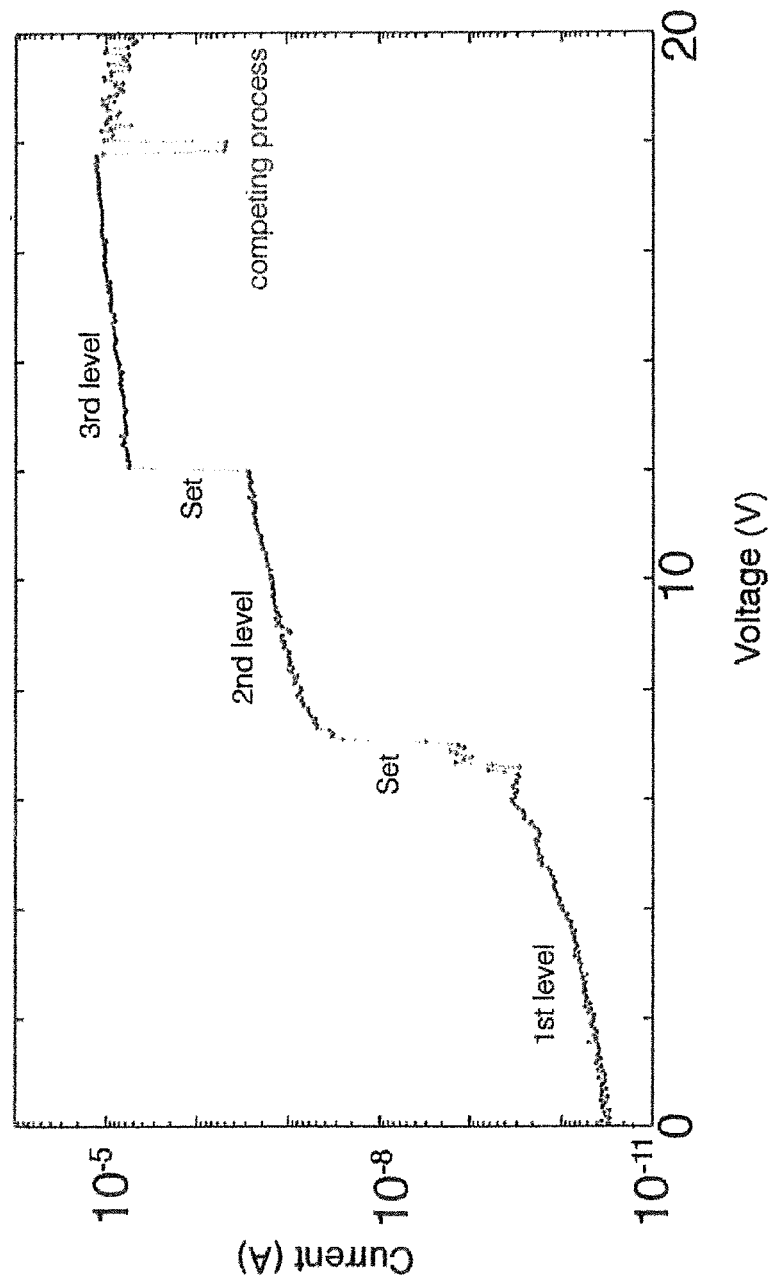

FIG. 8(a) shows that the formation/destruction process in the memory resistor is independent of bias polarity. This indicates that conduction is due to migration of a single charged species.

Figure 8B:
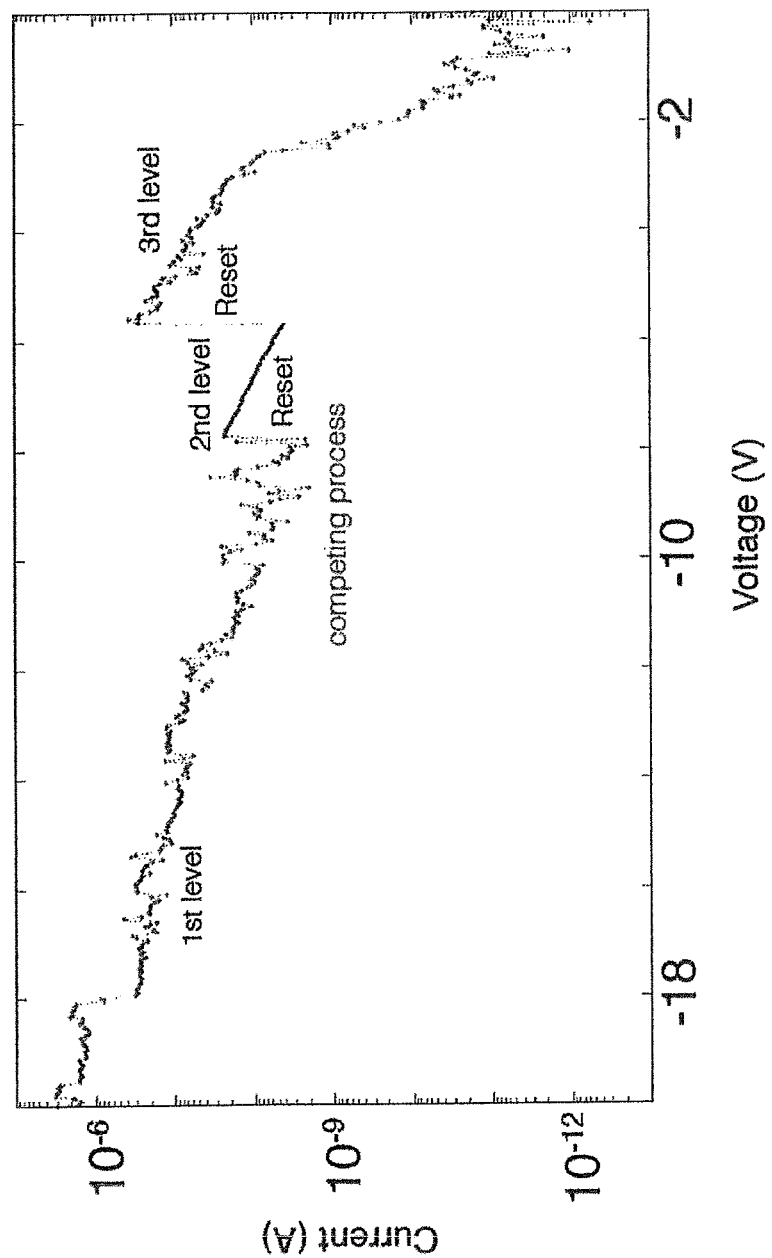
Figure 8C:
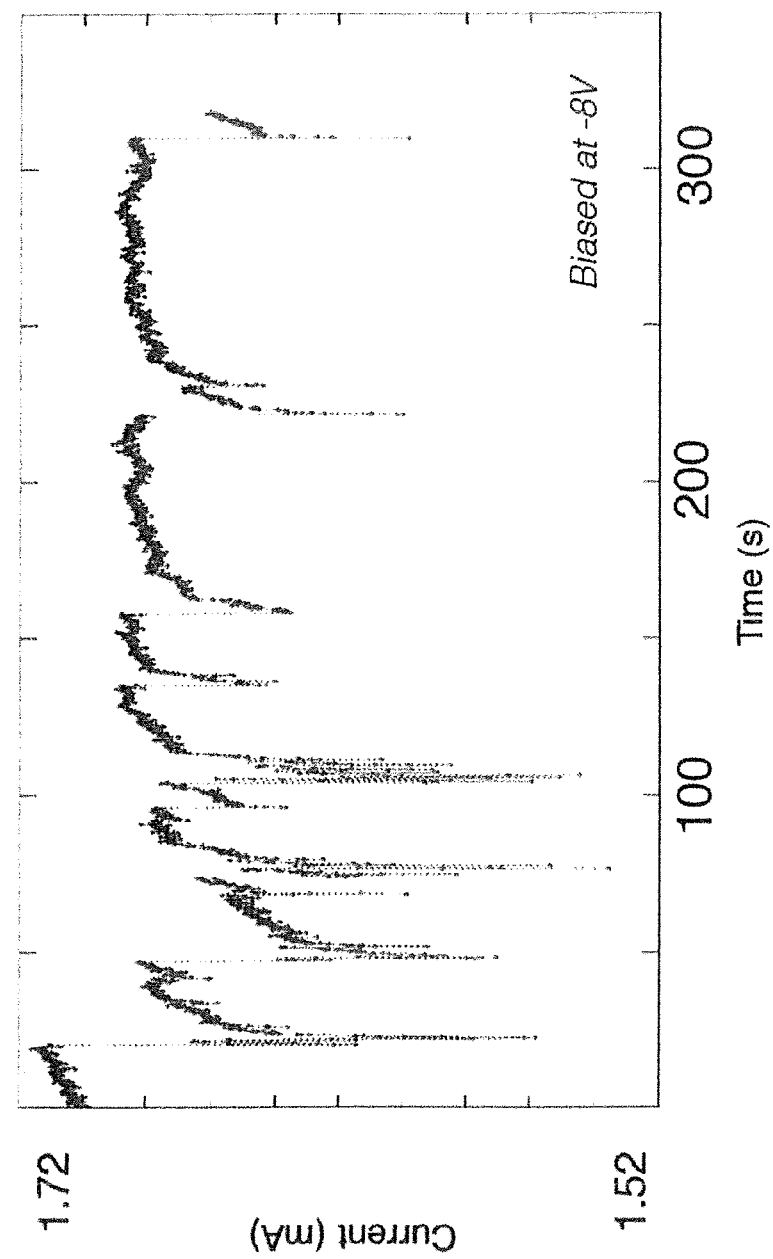
Figure 8D:
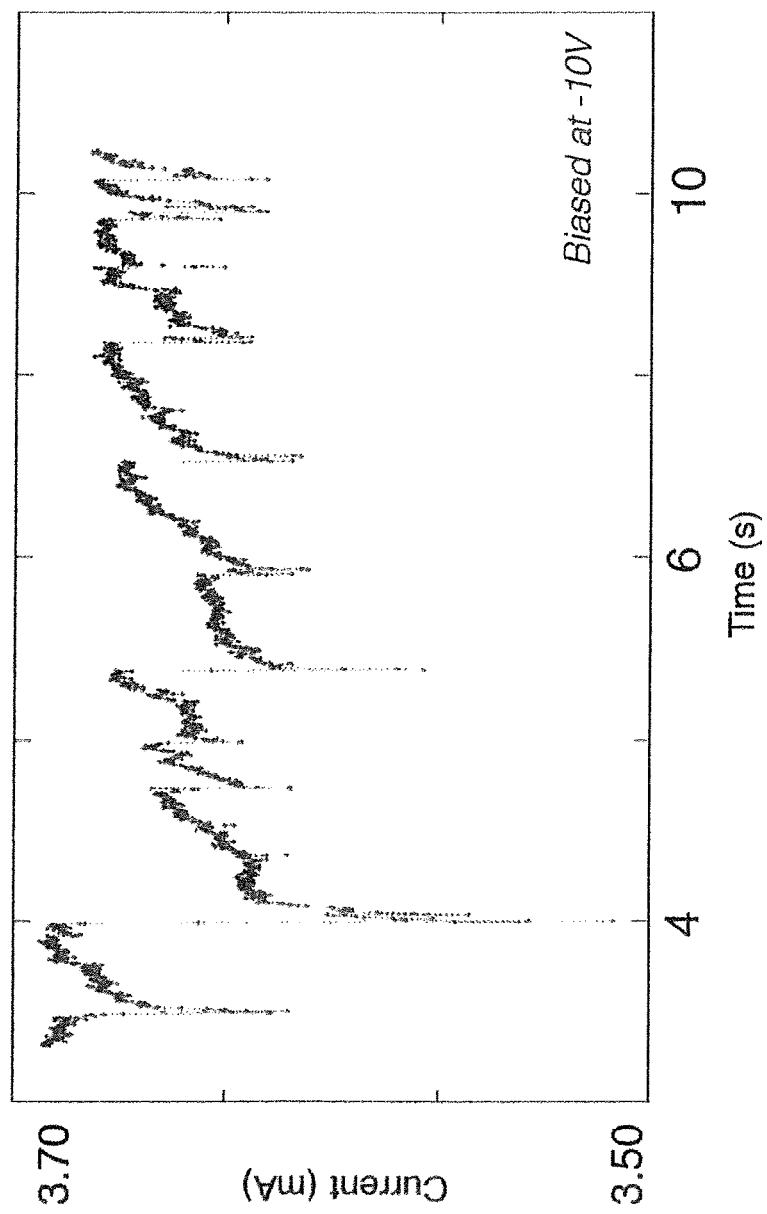

FIG. 8(a), which is an IV curve in positive bias, shows three distinct levels (two set processes and a competing process between setting and resetting). FIG. 8(b), which is an IV curve in negative bias, also shows three distinct levels (two reset processes and competing process). This shows that three levels can be obtained with this device, which may be useful for multi-level logic systems.

FIGS. 8(c) and (d) show current-time graphs under constant voltage biases of −8V and of −10V. Formation (set) and destruction (reset) processes act in opposition. FIGS. 8(c) and (d) show sudden current drops followed by exponential increases. The measurement time resolution (5 ms) is insufficient to track the set/reset process, preventing observation of the complete OFF state. Nevertheless, a very rapid current decrease followed by a slower recovery is observed. Recovery speed is proportional to the applied voltage; the time constant decreases from 10 sec to around 0.5 sec on changing the bias from −8V to −10V. Higher negative voltages reset the device faster than can be resolved by the measurement system without repetitive transitions to the ON state, as the current is sufficient for conductive pathway destruction to dominate. A similar scenario with a stable ON state occurs when the bias is decreased to values lower than 6V. These results indicate that there are two conditions: high field and low current (inversion) in which filament formation is favoured; and high field and high current (accumulation) in which destruction dominates. No reset process is observed by applying a high negative bias with limited current ($10^{-7}$ A) to the memory resistor, regardless of bias level, indicating that the reset process is current-driven through Joule heating.

The resistive switching processes displayed by the memory resistor are attributed intrinsically to the silicon-rich silica layer. The set/reset process is not dependent on bias polarity, which excludes the possibility that conduction is driven by the migration of a single charged species. In addition, measurements performed on samples fabricated with an n-type silicon top electrode contact show similar behaviour of clear controllable switching compared to those having an ITO top electrode.

It will, of course, be understood that the present invention has been described above purely by way of example and that modifications of detail can be made within the scope of the invention.

The invention claimed is:

1. A memory resistor having an on state and an off state, comprising:
   (a) a first electrode;
   (b) a second electrode; and
   (c) an inhomogeneous dielectric layer disposed between the first and second electrodes, wherein the dielectric layer comprises an inhomogeneous dielectric material having multiple domains comprising column structures;
   wherein the dielectric layer further comprises amorphous nanoparticles of semiconductor material, and wherein in the on state the nanoparticles form at least one conductive filament encapsulated by the dielectric layer, thereby providing a conductive pathway between the first electrode and the second electrode, wherein the at least one conductive pathway is formed at least in part along a boundary between two of said domains;
   wherein the memory resistor is configured to be taken from the off state to the on state when a set voltage is applied in a set process;
   wherein the on state is low resistance and the off state is high resistance; and
   wherein the memory resistor is configured to return from the on state to the off state when a reset voltage is used to produce a current in a reset process.

2. The memory resistor of claim 1, wherein the dielectric is an oxide of silicon, or wherein the dielectric is silicon nitride or silicon oxynitride.

3. The memory resistor of claim 2, wherein the dielectric is silicon dioxide ($SiO_2$).

4. The memory resistor claim 1, wherein the nanoparticles of semiconductor material are silicon nanoparticles, or wherein the nanoparticles of semiconductor material are germanium nanoparticles.

5. The memory resistor of claim 1, wherein the first electrode is p-doped and the second electrode is n-doped, or the first electrode is n-doped and the second electrode is p-doped.

6. The memory resistor of claim 5, wherein at least one of the first electrode and the second electrode is silicon.

7. An array comprising at least one memory resistor as defined in claim 1.

8. The memory resistor of claim 1, wherein:
   the set voltage has a positive bias and the reset voltage has a negative bias.

\* \* \* \* \*